United States Patent [19]

Balanca et al.

[11] 4,034,362

[45] July 5, 1977

[54] DEVICE FOR AUTOMATIC PROCESSING OF SIGNALS RECORDED ON AN OSCILLOSCOPE SCREEN

[75] Inventors: Charles Balanca, Corbreuse; Gilbert Charles, Chatillon-sous-Bagneux, both of France

[73] Assignee: Commissariat a l'Energie Atomique, Paris, France

[22] Filed: Feb. 6, 1976

[21] Appl. No.: 655,958

[30] Foreign Application Priority Data

Feb. 18, 1975  France .............................. 75.05021

[52] U.S. Cl. .................... 340/347 AD; 235/61.6 A; 340/146.3 AG
[51] Int. Cl.[2] .......................................... G06F 3/00
[58] Field of Search ........... 340/347 M, 146.3 AG, 340/347 AD; 235/61.6 A; 178/6.8

[56] References Cited

UNITED STATES PATENTS

| 3,566,396 | 2/1971 | Paine | 340/347 M |
|---|---|---|---|
| 3,621,130 | 11/1971 | Paine | 178/6.8 |
| 3,644,714 | 2/1972 | Phillips | 235/61.6 A |
| 3,719,777 | 3/1973 | Reichenbach | 235/61.6 A |
| 3,723,970 | 3/1973 | Stoller | 340/146.3 AG |
| 3,908,081 | 9/1975 | Greenberg | 235/61.6 A |
| 3,935,562 | 1/1976 | Stephens | 340/146.3 AG |
| 3,973,239 | 8/1976 | Kakumoto | 340/146.3 AG |

Primary Examiner—Charles D. Miller
Attorney, Agent, or Firm—William R. Woodward

[57] ABSTRACT

In a digital storage system for oscilloscope trace data, in order to obtain precisely the ordinate of an oscilloscope trace at the intersection of a scanning line therewith in a television camera image of the trace, a scan/trace intersection profile signal is compared with a multiplicity of threshold values to generate a set of rectangular pulses of a duration equal to the threshold-override interval, and the pulse for the highest threshold is selected and processed to determine the true intersection ordinate by forming the half-sum of the ordinates of the leading and trailing edges of the pulse. This ordinate and the line scan number are provided as a pair of digital quantities (addresses) for storage in a digital memory.

5 Claims, 10 Drawing Figures

DEVICE FOR AUTOMATIC PROCESSING OF SIGNALS RECORDED ON AN OSCILLOSCOPE SCREEN

This invention relates to a device for the automatic processing of signals recorded on an oscilloscope screen. By means of this automatic process, the information contained in the signal which appears on a screen can be written in digital form in a computer memory.

As is already known, it often proves useful to store in memory as a result of analog-digital conversion a signal which appears on an oscilloscope screen. This is particularly desirable in the case of random triggering phenomena having configurations which cannot readily be reproduced. In fact, it is possible to trigger the scanning of an oscilloscope at the time of appearance of such signals but it is necessary in that case to record automatically all the information contained in said signals which are scanned at high speed on the screen. Moreover, it is often necessary to carry out digital processing of the signal after recording in order to compare said signal with theoretical curves: the device in accordance with the invention converts the different points of the signal which appears on the oscilloscope to digital form and permits complete processing of the signal with very great ease without any need for manual action on the part of an operator.

A first type of conventional analog-digital converter permits coding of signals in real time and output of the signal data in real time. In this type of analog-digital converter for processing signals, the signal is not placed in memory; only the sample being coded is stored during the period of the sampling step. Analog-digital converters of this type are commonly designed for television signals (sampling frequency of 12 Mcs and resolution of 8 bits). The present limits of this type of converter are of the order of 50 Mc/s in respect of a resolution of 6 bits. This is insufficient for many applications such as the observation of nuclear times of flight, laser implosions or extremely fast optical signals.

A second type of analog-digital converter carries out real-time coding with a delayed-time data output. These converters utilize the same principles as those mentioned above but the data are stored in a digital memory before being employed by a subsequent process.

Since the digital memory has a limited capacity, this type of converter permits recording of signals only over a very limited period.

These devices are adapted to the recording of transient phenomena. The sampling frequency can attain 100 Mc/s with a resolution of 8 bits but a limitation is set by the number of memory words.

A third type of analog-digital converter employs delayed-time coding and delayed-time data output.

In this type of converter and of image-processing devices, there is analog storage of the signal prior to coding and nearly always storage in digital form after coding. The analog store can be a magnetic tape, for example.

The analog-digital converter which is included in the device for automatic processing of signals recorded on an oscilloscope screen in accordance with the invention falls in the third class mentioned above.

The device in accordance with the invention makes it possible to record extremely fast transient signals which are written on an oscilloscope screen even with a low degree of luminosity; the device also permits delayed-time data storage at the rate of assimilation of the data by a computer, with the result that a limitation is not set by the rate of absorption of information by the computer but only by its memory capacity. Finally, irrespective of the thickness of the signal trace on the oscilloscope screen, a coder which forms part of the device in accordance with the invention makes it possible to determine the amplitudes of the points of the trace which have maximum luminosity. This permits optimum recording of the real curve corresponding to the signal recorded on the screen without any need for manual operation.

In more exact terms, the present invention is concerned with a device for automatic processing of signals recorded on an oscilloscope, the device in accordance with the invention being provided with an oscilloscope screen which is scanned by the signal $x(t)$ to be recorded as a function of the time interval $t$ and a camera which is optically adjusted so as to produce the image of the oscilloscope screen on a storage target. The device in accordance with the invention further comprises a unit for electron scanning of said storage target; the scan consists of a series of lines which are parallel to each other and perpendicular to the time axis of the image $x'(t)$ of the signal $x(t)$ on said storage target, said lines being such as to correspond to the displacement of the point of impact of an electron beam which scans said target. The device in accordance with the invention further comprises electronic means for associating with each line, in a line address counter, a line address $n$ which varies from 1 to N and a coder for associating a word address $m$ which varies from 1 to M in a word address counter at each maximum value of the signal $y(\tau)$ which corresponds to the intersection of the electron beam with the image $x'(t)$ of the signal $x(t)$ on the storage target; the parameter $\tau$ varies from the zero value corresponding to commencement of scansion of a line to a maximum value corresponding to the time required for scanning one line in respect of each line. The signal $y(\tau)$ is zero (subject to background) when the line scanned by the electron beam does not intersect the trace of the image $x'(t)$. Finally, the device comprises means for sequentially recording the pairs of addresses $(n, m)$ on a memory of digital type, these pairs of coordinates being intended to constitute all the information contained in the signal $x(t)$.

In order to observe with accuracy the maximum amplitude of the signal $y(\tau)$ corresponding to the intersection of the scanning electron beam with the image $x'(t)$ on the storage target, a coder is employed. The coder comprises electronic means for comparing the signal $y(\tau)$ with a series of threshold values having increasing amplitudes $S_1, S_2 \ldots S_i \ldots S_k$. The coder also comprises electronic means for generating signals of constant amplitude $M_i(\tau) = AY[y(\tau) - S_i]$ where $Y$ is a step function having an amplitude which is equal to 1 when and only when $y(\tau) - S_i \geq 1$, $A$ being a coefficient of proportionality which is independent of the parameter $\tau$. The coder further comprises means for selecting the nonzero signal $M_j(\tau)$ which corresponds in the case of each signal $y(\tau)$ to the maximum threshold value $S_j$ and means for calculating in respect of said selected signal $M_j(\tau)$ the value of the time parameter corresponding to the half-sum of the values of $\tau$ which are associated with the leading edge and with the trailing edge of the signal $M_j(\tau)$. This device makes it possible by electronic means to provide an accurate calculation of the maximum value or values of the curve $y(\tau)$. There is associated with each value of $\tau$ a word address $m = \tau$ and a line address $n$.

The device in accordance with the present invention can also include a buffer memory which stores the pairs of addresses ($n$, $m$) progressively as these latter are delivered by the coder and which restitutes these pairs of addresses at constant frequency in a computer memory at the recording frequency of said memory.

Further properties and advantages of the invention will become more readily apparent from the following description of exemplified embodiments which are given by way of explanation without any implied limitation, reference being made to the accompanying drawings, wherein:

Figure 1:
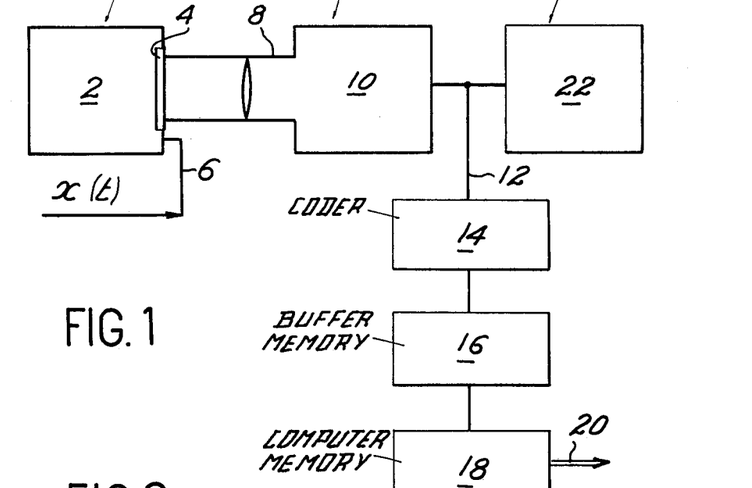
FIG. 1 is a block diagram of the device according to the invention.

There is shown in FIG. 1 a block diagram of the device in accordance with the invention which comprises an oscilloscope 2 having a screen 4, said oscilloscope being triggered by the signal $x(t)$ which is introduced via the channel 6. A mechanical and optical adaptation unit 8 is coupled with a television camera 10; the video signal delivered by said television camera is transmitted via the channel 12 to a coder 14; the signals consisting of pairs of addresses ($n$, $m$) emitted by said coder are fed into a buffer memory 16 which transmits said signals to a computer memory 18; the pairs of addresses corresponding to the signal $x(t)$ are delivered as required by the output 20 of said memory in order to permit viewing on a screen, recording on a printer and so forth. A television monitor 22 which is not essential to the operation of the device in accordance with the invention but facilitates its operation permits continuous viewing of the screen 4 of the oscilloscope 2 on the screen of said television monitor in order to carry out adjustments on said screen. The analog-digital converter which forms part of the invention is constituted by a combination of the oscilloscope 2, the camera 10 and the coder 14.

The oscilloscope 2 produces an image of the signal $x(t)$ on its screen 4. In the case of a transient signal $x(t)$, said image lasts only a few microseconds (decay time of the photosensitive layer of the screen). It is necessary to extract all the information contained in the signal $x(t)$ which scans the oscilloscope screen during this scansion period.

The television camera 10 views the oscilloscope screen 4 by means of a mechanical and optical adaptation unit 8. Said camera delivers the video signal containing all the information relating to the image which appears on the screen. It is the image-tube target of said camera (not shown in the figure) which performs the function of analog memory. In fact, in the case of a light signal which lasts a few microseconds on the screen of the oscilloscope, a signal which lasts about 100 milliseconds is obtained on the target of the camera.

The television camera 10 is of a conventional type, for example, having 625 lines and interlaced scanning. The camera is equipped with a highly sensitive image tube. The television camera 10 is placed in front of the oscilloscope screen by means of the unit 8 so that the line scanning is orthogonal to the scanning of the time-base of the image $x'(t)$ of the signal $x(t)$ on the storage target. Said adaptation unit 8 delivers onto the storage target of the camera an image $x'(t)$ which is identical in every respect with the image $x(t)$ obtained on the screen of the oscilloscope, the only difference being that this image lasts a sufficient period of time to permit of analysis by the camera beam which scans said storage target.

The coder 14 processes the video signal derived from the camera and delivers in digital form the addresses $m$ of the points of intersection of each television line with the signal $x'(t)$. The signal corresponding to one point of the curve $x(t)$ or $x'(t)$ is defined by two addresses, the first (line address $n$) being the number of the line ($n = 0$ to 576) and the second (word address $m$) defines the position of the point of intersection of the line beam with the signal $x'(t)$ ($m = 0$ to 53 microseconds). In one exemplified embodiment of the invention, consideration being given to a television image composed of 625 lines, there are 576 useful lines, which corresponds to the fact that the value of the address $n$ varies between 0 and 576. The time-duration of one line is 64 $\mu$s. The value of $m$ varies not between 0 and 64 $\mu$s but between 0 and 53 $\mu$s by reason of the width of the line synchronizing signal which has a time-duration of 11 $\mu$s.

Since the user is no longer able to observe what takes place on the screen as a result of mechanical adaptation of the camera to the oscilloscope, the screen of the oscilloscope is reproduced on the screen of the television monitor 22; this monitor makes it possible to observe the signal in direct time and to carry out adjustment of thickness intensity of the trace on the screen 4 of the oscilloscope 2.

The type of oscilloscope is left to the user's discretion. The pass-band of the analog-digital converter in accordance with the invention is equal to that of the oscilloscope. The light intensity of the trace is inversely proportional to the scanning rate of the oscilloscope but the use of an imaging system with storage target achieves enhanced brightness, thus permitting the observation of traces which are not visible to the naked eye, that is, a gain in information. In order to ensure that a light intensity can be utilized, the camera must deliver a video signal which is utilizable within the coder or in other words must have a sufficient level. As will be seen hereinafter, the thickness of the trace has no real influence on the processing of information since the coder in the device according to the invention takes this into account. The use of a television camera equipped with a tube designated by the trade name Nocticon TH 9655 and manufactured by the Thomson CSF Company permits a sensitivity of the order of 100 $\mu A$. $Lux^{-1}$. This camera makes it possible to employ the majority of oscilloscopes up to their maximum level of performance.

Figure 2:
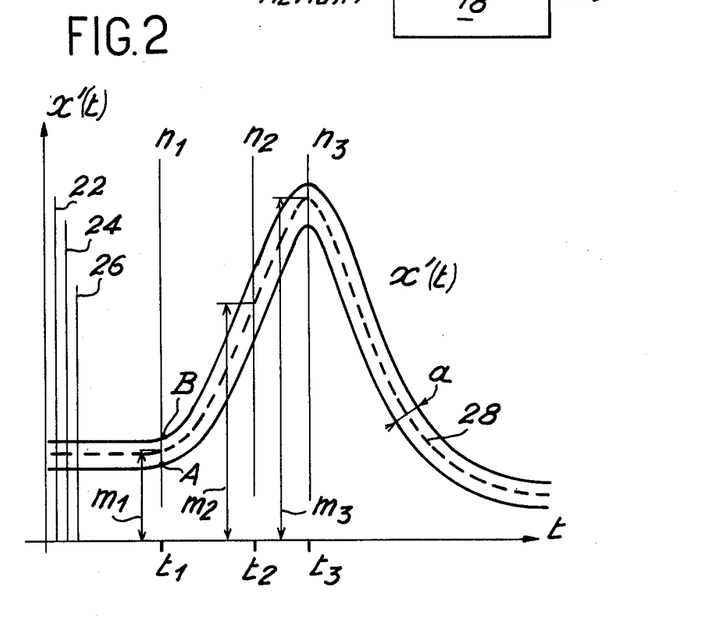
FIG. 2 is a diagram representing the collection of data from a curve $x'(t)$, said data being recorded on the storage target of the camera.

There is shown in FIG. 2 the image of the trace $x'(t)$ which appears on the storage target of the camera 10, said trace $x'(t)$ being equivalent in all respects to the trace $x(t)$ which is obtained on the screen 4 of the oscilloscope 2. It is this image $x'(t)$ which is scanned by the electron beam of the television camera in accordance with means of extremely conventional type (not shown) in order to permit codification of the signal. The scanning lines are chosen so as to have a direction at right angles to the time axis $t$, these lines being represented at 22, 24, 26, $n_1$, $n_2$, $n_3$. The useful addresses corresponding to these lines are designated by $n$ which varies between 0 and 576. The trace $x'(t)$ has a variable thickness $a$ which is not negligible. The word address $m_1$ which is associated with the line $n_1$, for example, corresponds to the value of the parameter $\tau$ which measures the time interval between commencement of scanning of the line $n_1$ and the instant of intersection of the line $n_1$ with the center of the trace 28 which corresponds to the maximum intensity of said trace $x'(t)$. The electronic device for measuring the address $m_1$ which corresponds to said time interval will be described in detail hereinafter.

A video signal $y(\tau)$ is extracted from the camera along channel 12. This signal measures the variation in the charge accepted by the target on which an impression has previously been made by the signal $x'(t)$ as a function of the scanning of said target by the electron beam. When the beam intercepts that portion of the target which is located roughly between the points A and B, said target which is made conductive by the impression of the recorded optical signal $x'(t)$ delivers a current whose intensity is proportional to the light density of the trace $x'(t)$ on the storage target. The constructional detail of the target and the measurement of the current are conventional and call for no extended description.

The time interval $t$ corresponding to each point of the sampled signal $x'(t)$ is recorded in digital form by the corresponding line address $n$ and the amplitude of the signal $x'(t)$ is codified by the word address $m$.

Figure 3:
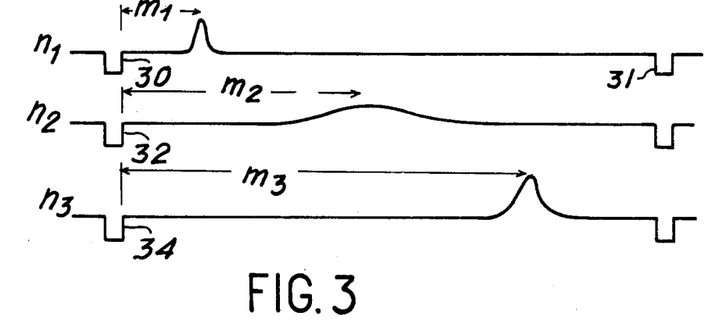
FIG. 3 shows the different information-processing signals which serve to measure the maximum value of the amplitude of the signal $y(\tau)$ corresponding to the intersection of a scanning line with the signal $x'(t)$ from which the information is to be extracted.

There are shown in FIG. 3 three curves $y(\tau)$ corresponding to three values of the line address $n_1$, $n_2$ and $n_3$ which are shown in FIG. 2. The signals 30, 31, 32 and 34 of rectangular waveform provide the line synchronizing pulses or "pips". The time interval which elapses between two pulses such as 30 and 31 is 64 $\mu s$ in the example of embodiment with a conventional television camera. The width at the mid-height of the peaks of the curve $y(\tau)$ depends on the line address $n$. The three values $m_1$, $m_2$ and $m_3$ corresponding to the peaks of the curves $y(\tau)$ represent the ordinates of the curve 28 which is shown in FIG. 2. The coder which will be described hereinafter associates pairs of addresses $(n, m)$ with each line.

The video signal consists of a sequence of signals $y(\tau)$ corresponding to each line which arrives sequentially in the coder 14 of FIG. 1 from the output of the television camera 10 via the channel 12.

Figure 4:
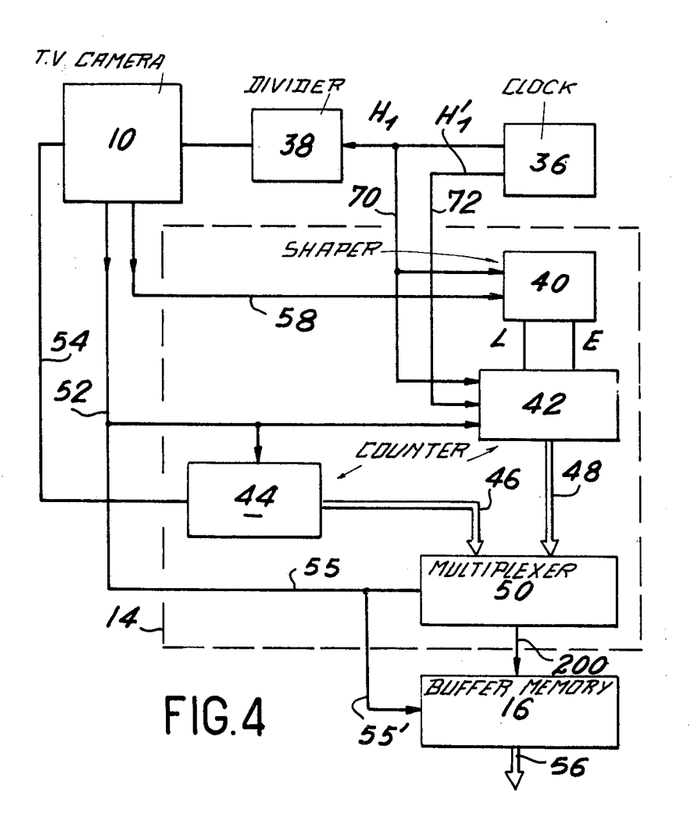
FIG. 4 is an electronic block diagram of a portion of the device according to the invention.

FIG. 4 shows more precisely the arrangement of the electronic units for control and processing of the signals derived from the camera 10.

In this flow chart, an oscillator or clock 36 delivers a signal $H_1$ (at a frequency of 8 Mc/s in this example of construction). Said signal has been generated by a quartz oscillator having a frequency of 32 Mc/s, is passed through a divider 38 having a ratio of 1/256, then controls the line scansion of the camera. The signal $H_1$ consists of a series of successive equidistant pulses which are also employed subsequently in the counting units. The unit designated as the coder 14 proper comprises a unit for shaping the video signal 40 which is connected to a word address counter 42, and a line address counter 44, the outputs of these two units being connected by the channels 46 and 48 to a multiplexer 50 which is in turn connected to the buffer memory 16. The word address is determined by the units 40 and 42 and the line addresses are determined by the unit 44. A single supply from the clock 36 for controlling the camera and the counting units of the coder causes these elements to operate in a synchronous manner. The line address $n$ is obtained on channel 46 by the synchronous counter 44 which is supplied by the line-synchronizing signal delivered by the camera 10 via channel 52.

The synchronous counter located within the unit 44 is incremented by one unit at each line-synchronizing signal which is shown at 30, 31, 32 and 34 in FIG. 3 and delivered via channel 52. It is necessary to have a field-synchronizing signal delivered by the camera 10 via channel 54 for zero-resetting of the line counter.

The determination of the word address $m$ is slightly more complex and is performed in the units 40 and 42. In very general terms, this operation is carried out by means of a synchronous counting unit which operates at 8 Mc/s and is reset to zero by the line-synchronizing signal: each time the presence of information corresponding to a "word" is detected in the video signal, the value of said counting unit is recorded. The line address and word address $(n, m)$ which are obtained through the channels 46 and 48 are then multiplexed. The multiplexer 50 is controlled by the line-synchronizing signal transmitted via the channel 55 which is connected in parallel with the channel 52 from the camera. The multiplexer records the line address during the time of the synchronizing signal and the word address outside the synchronizing signal. All the circuits define in the foregoing operate continuously to the same extent as the television camera. When a recording operation is initiated, the data are transmitted from the multiplexer 50 into the buffer memory 16 and the output of said memory (channel 56) is connected to the input of a computer (not shown in FIG. 4).

The line address counter 44 is a 10-bit binary counter for representing the line addresses. Since the television image consists of 625 lines, there are therefore 312.5 lines per field. The zero-weight bit of said line address is supplied by the field-parity signal in the line address counter. The line address counter is constructed in conventional manner by means of three cascade-connected integrated circuits of the type designated as SN 741 61 and manufactured by Texas Instruments.

In fact, in one embodiment of the invention, the line address counter is increased by two units for each line-synchronizing signal and it is the field-parity signal which provides the lowest-weight bit of the line counter in the standard case of interlaced scanning with two fields which is well known to anyone versed in the art.

So far as the word address counter is concerned, the counting frequency being 8 Mc/s and the useful time-width or duration of a television signal being approximately 53 $\mu$s, the word addresses are within the range of 0 to 424.

Figure 5:
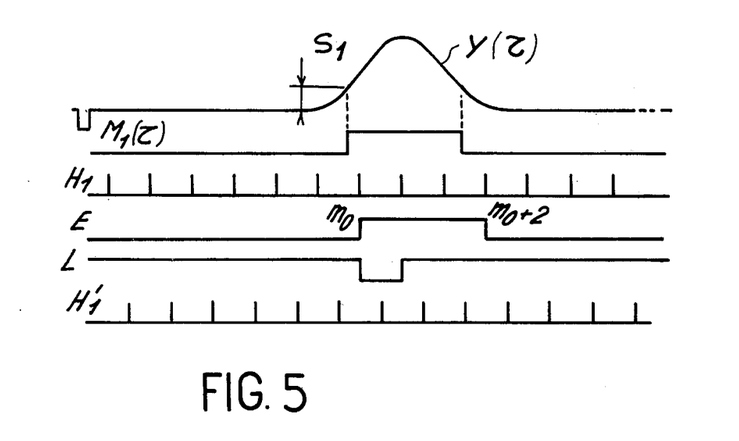
FIG. 5 depicts the signals employed for processing the information contained in a scanning line of the video signal.

In FIG. 5, there is shown in detail the synchronism of the different signals obtained at the output of the unit 40 which delivers counting permission signals E and transfer order signals L which control the counting units of the element 42. A video signal $y(\tau)$ corresponding to a video line is shown at the top of the figure. This signal passes into the unit 40 via channel 58 and is compared with a threshold voltage $S_1$ so as to deliver to the second line $M_1(\tau)$ a logical signal having a value 1 when the value of $y(\tau)$ oversteps the threshold value $S_1$. We have $M_1(\tau) = AY(y(\tau) - S_1)$. The value of the coefficient A is for example equal to 1.

The signal $H_1$ is the signal emitted by the clock 36, the signal $H'_1$ being a signal of the same frequency as the signal $H_1$ which is emitted by the same clock and displaced by one half-period with respect to the signal $H_1$. The signal $M_1$ is synchronized with the signal $H_1$ so as to produce the counting permission signal E shown on the fourth line of FIG. 5. At the time of transition 0 $\rightarrow$ 1 of the signal E, the signal 40 delivers the signal L, the time-duration of which is smaller than or equal to that of a clock period.

The fact that E and L are synchronized by the clock signal $H_1$ permits reliable operation of the counter, the transitions of E and of L being centered between two transitions of $H'_1$.

Figure 6:
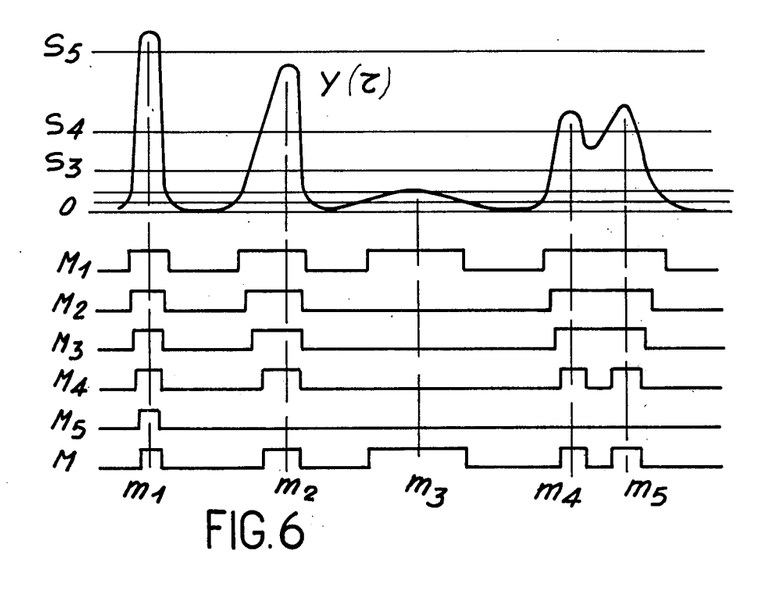
FIG. 6 depicts the signals obtained by comparison of the video signal corresponding to a line having a plurality of peaks with a series of thresholds $S_i$.

There is shown in FIG. 6 a video signal $y(\tau)$ corresponding to a number of signals $x(t)$ obtained on the target and consequently comprising a number of peaks on the same line. As will become apparent later, in this exemplified embodiment the signal $y(\tau)$ is compared with different threshold signals which vary in a geometrical progression having a common ratio of 2, namely the threshold signals $S_1$, $S_2$, $S_3$, $S_4$ and $S_5$ which are below the level of saturation of the video signal. There corresponds to each threshold signal a signal $M_i$ such as the signals $M_1$, $M_2$, $M_3$, $M_4$, $M_5$ so as to ensure that:

$$M_i = AY [y(\tau) - S_i]$$

where y is the Heaviside step function having an amplitude equal to 1 when $y(\tau) / S_i \geq 0$.

In the electronic circuits 40 and 42 which are described in detail below, there will be generated the signal $M_i$ corresponding to all the peaks and the corresponding addresses $m_1$, $m_2$, $m_3$, $m_4$ and $m_5$.

Figure 7:
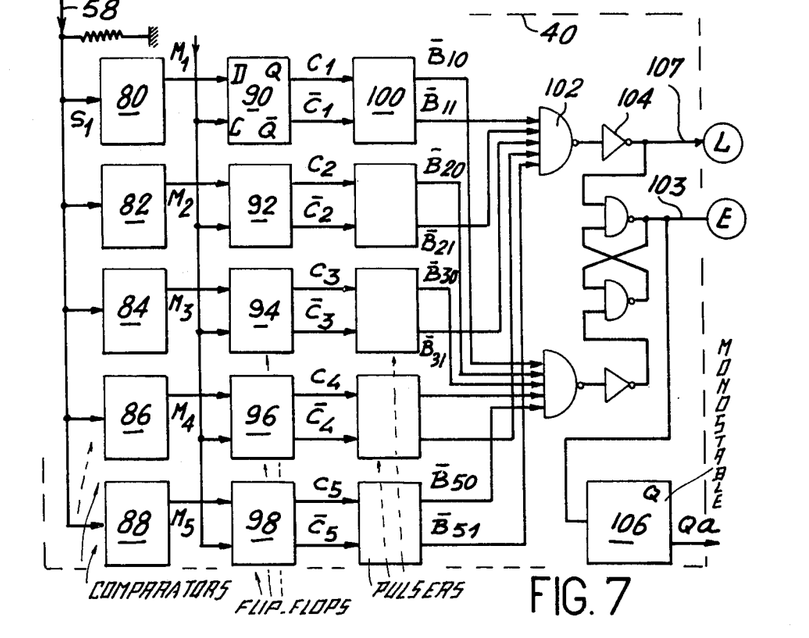
FIG. 7 is an electronic diagram of a portion of the coder which makes it possible to obtain transfer and counting orders, that is, the signals L and E of FIG. 5.

FIG. 7 is a block diagram showing the constructional detail of the electronic circuit 40 for producing the signals L and E, the counting permission signals and transfer order signals as shown in FIG. 5 in the case in which a plurality of thresholds is employed as in the example illustrated in FIG. 6. The video signal delivered by the camera is transmitted via the lead 58 to different comparators 80, 82, 84, 86 and 88 in which the threshold values are $S_1$, $S_2$, $S_3$, $S_4$ and $S_5$; at the output of said comparators 80 to 88, there are obtained the signals $M_1$, $M_2$, $M_3$, $M_4$ and $M_5$ as shown by way of example in FIG. 6 in the case of the signal $y(\tau)$ which is illustrated therein.

The signal M is then synchronized with the signal $H_1$ so as to obtain the signals E. The clock signal $H_1$ is directed via the lead 70 into the flip-flops 90 (type SN 74 H 74) which permit synchronization of the signal $M_i$ with the signal $H_1$. At the output, the signals $C_i$ and $\overline{C_i}$ are logical signals corresponding to the signals $M_i$ but synchronized with the signal $H_1$. In the case of a single threshold, the signal $C_i$ corresponds to the signal E of FIG. 5. The signals $C_i$ are fed into pulsers 100 in order to obtain at the output the signals $\overline{B_{i0}}$ and $\overline{B_{i1}}$. These pulsers 100 of conventional type deliver pulses on the leading edge of the signal $C_i$ (output signal $\overline{B_{i0}}$) and on the trailing edge of the signal $C_i$ in the case of the output signal $\overline{B_{i1}}$.

The signal L is generated from signals $\overline{B_{i1}}$ via the gates 102 and 104. This control signal L is transmitted on the lead 107 each time a 0 $\rightarrow$ 1 transition is detected on one of the signals $C_i$:

$$L = \overline{B_{11} + B_{21} + B_{31} + B_{41} + B_{51}}$$

The signal changes to the value 1 in the case of any 0 $\rightarrow$ 1 transition and returns to zero at any 1 $\rightarrow$ 0 transition of the signals $C_1$. Moreover, a word collection order is emitted by means of the monostable device 106 at each 1 $\rightarrow$ 0 transition of the signal E.

Figure 8:
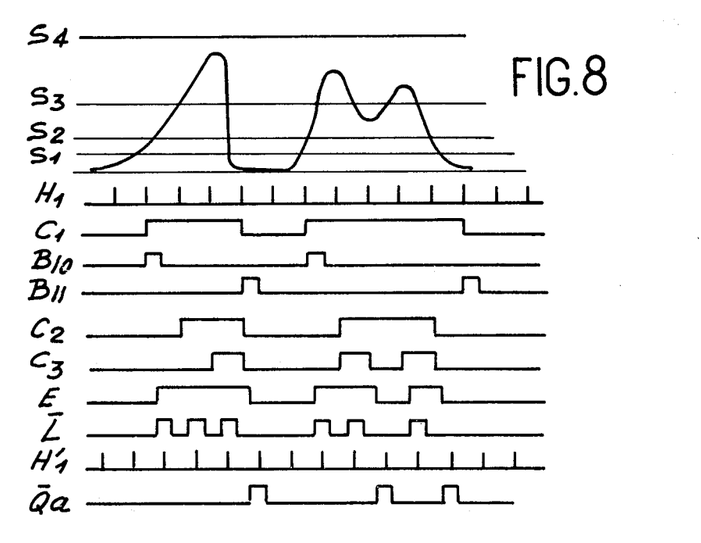
FIG. 8 depicts the logical signals employed for processing information in the computing element of FIG. 7.

When a number of pulses L are present during the time of E, the value of the second word counter shown in FIG. 8 is re-initialized by each of said pulses and the last value corresponding to the last threshold which was passed is in fact recorded.

FIG. 8 shows the different logical signals which appear at various points of the computing element 40 of FIG. 7.

Each threshold comparator such as those indicated by the references 80, 82, 84, 86 and 88 is composed of a comparator proper with which there can be incorporated a low-pass filter for the first order which is located upstream in order to eliminate noise prior to introduction into the comparator.

The cut-off frequency of the filter can be chosen so as to be as low as the level $F_i$.

Figure 9:
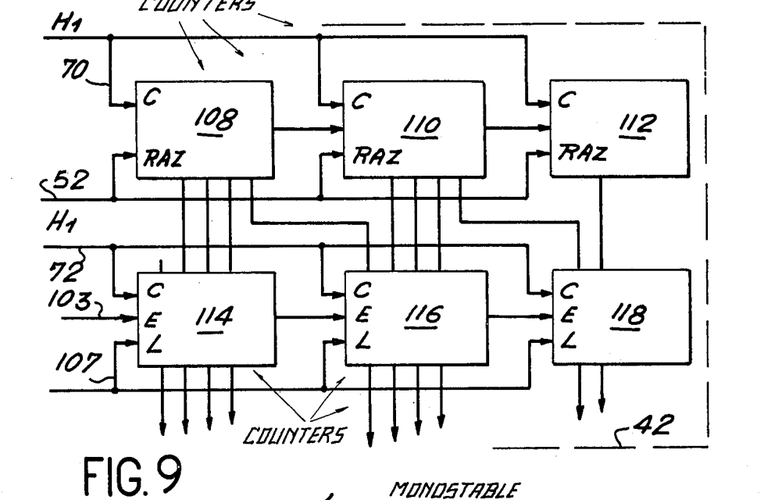
FIG. 9 illustrates the electronic computing units for determining the word address $m$.

FIG. 9 shows the electronic detail of the counting unit 42 which essentially comprises two counting units, one unit being synchronized with the clock pulses $H_1$ and the other unit being synchronized with the pulses $H'_1$; one unit comprises the elements 108, 110 and 112 and the other unit comprises the elements 114, 116 and 118. All these counting units being synchronous counters of type FN 74 161 which are manufactured by Texas Instruments. The first counting unit constituted by the units 108, 110 and 112 is incremented at intervals of 125 ns (frequency of the signal $H_1 = 8$ Mc/s) by the successive pulses supplied by the clock $H_1$ via channel 70. This incrementation is carried out at the 0 $\rightarrow$ 1 transitions of the clock signal $H_1$ and said counting unit is returned to zero (R.Z.) at intervals of 64 $\mu$s by the line-synchronizing signal which is transmitted via channel 52 and derived from the camera 10. The second counting unit constituted by the three counters 114, 116 and 118 determines the word addresses. Said unit is fed by the pulses $H'_1$ which are delivered by the clock 36 via channel 72. The inputs L of the three stages 114, 116 and 118 of the second counting unit are connected to the channel 107 of FIG. 7. The signals E and L at the inputs E and L of the counters to which they are transmitted have been identified for the sake of conciseness, the input E being the "ENABLE" and the input L being the "LOAD" input. The input E of the stage 114 of the second counting unit is connected to the output channel 103 of the unit 40 shown in FIG. 7.

The modes of operation of the counters such as 108 as a function of the states of E and L are given in the following table.

| E | L | Mode of operation |
|---|---|---|
| 0 | φ | Blocked state |
| 1 | 1 | Counting at the frequency $H'_1$ |
| 1 | 0 | Synchronous parallel loading of $H'_1$ |

When the first counter has the value $m_0$ (binary word of 9 bits) at the moment of the 1 → 0 transition of the signal L and 0 → 1 transition of the signal E, the value $2m_0$ is transferred into the second counter by the first pulse of $H'_1$ which follows said transition (a shift to the right is carried out at the time of transfer and said output bits of the second counter are recorded); the shift to the right automatically performs multiplication by two. The following pulses of $H'_1$ on the second counting unit increment said counter during the time of the signal E. The 10-bit word at the output of said counter is designated as $m_2$ and the corresponding 9-bit word is designated as $m$ and equal to the rounded-off half of $m_2$ (the bit of lowest weight is removed from $m_2$). This value of $m$ constitutes the desired word address: this latter is comprised between 0 and 424 and the quantification error is comprised between −½ and +1.

The multiplexing circuit 50 which is controlled by the line synchronization through channel 55 is a unit of conventional type which is not described in detail since it is known to those versed in the art. Said unit makes it possible to record the value of the line address in the channel 46, to transfer it into the memory 16 together with the values of the word addresses transmitted via channel 48 in respect of the same value of the line address, and to begin the process again for a further value of the line synchronization transmitted via channel 55 for changing the line address by one unit and transferring a further series of word-address and line values into the memory 16.

Figure 10:
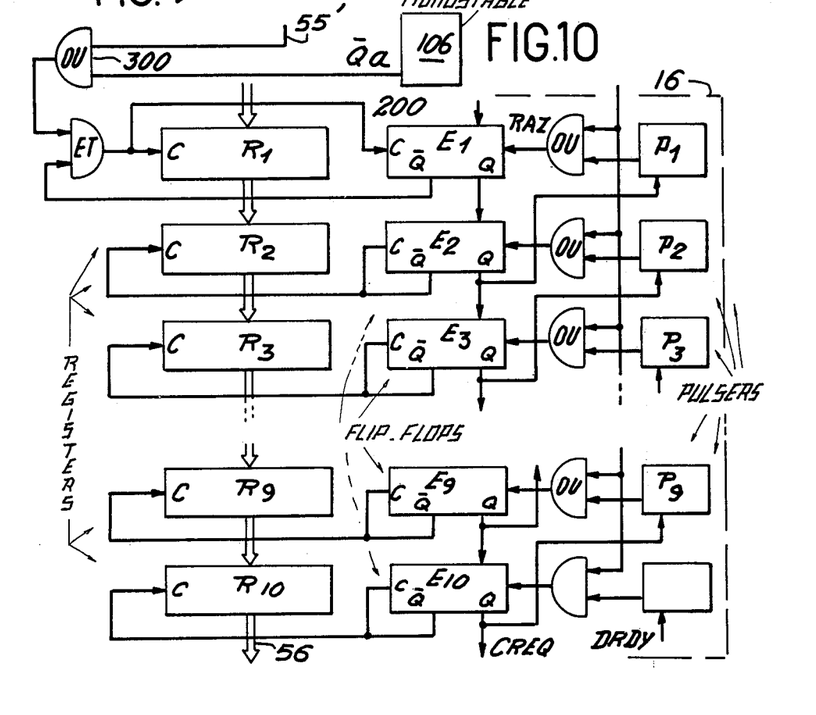
FIG. 10 is a schematic diagram which illustrates the construction of the buffer memory.

FIG. 10 shows the buffer memory 16 employed in a preferential embodiment of the invention prior to collection of data by a computer. Said buffer memory receives the addresses (n, m) at their frequency of appearance at the output of the multiplexer and retransfers them into a computer memory. The computer imposes the data collection frequency. In other words, the buffer memory is a regulator which serves to make the data input and output frequencies independent of each other.

In one embodiment of the invention, the coder is capable of processing a number of word addresses simultaneously (it is assumed that this number is equal at a maximum to 10). During the time interval of one line (64 μs), it is possible to have ten word addresses grouped together over a period of a few microseconds. At the output of the buffer memory, 64 μs are available for transmitting said ten addresses to the computer. The maximum rate of data transfer to a computer such as the "MULTI-8" computer constructed by the Intertechnique Company is of one octet at 1.1 μs intervals.

An address is constituted by 9 bits (word address) or 10 bits (line address); said address can be transmitted to the computer only in the form of two octets. A period of 2.2 μs is therefore necessary to transfer one address and the coder may possibly determine ten addresses during the same time interval. The presence of a buffer memory is therefore essential. The buffer memory shown in FIG. 10 is constituted by ten registers of 12 bits ($R_1$ to $R_{10}$) with which are associated 10 status flip-flops ($E_1$ to $E_{10}$). The status flip-flops are reset either by the memory reset signal (R.Z.) or by the signal obtained from one of the corresponding ten pulsers $P_1$ to $P_{10}$ ($E_i$ is reset by $P_i$). The pulser $P_i$ delivers a pulse at the time of the 0 → 1 transition of the output Q of the status flip-flop $E_{i+1}$. The assembly ($R_1$, $E_1$) is constituted by flip-flops D (the collection of data is carried out at the time of the 0 → 1 transition of the control signal C). The assemblies ($R_2$, $E_2$) to ($R_{10}$, $E_{10}$) are constituted by recopying flip-flops or so-called latches; these flip-flops are transparent (recopy when C = 1) and cut-off (memory when C = 0). The inputs of the OR-circuit 300 are connected by channel 55′ to the line-synchronizing signal and to the output Qa of the unit 106 shown in FIG. 7. The data-collection order signal corresponds to the mixture of signals of the line collection order and the word collection order. The content of a register $R_i$ is characterized by its status word $E_i$ (output Q of the status flip-flop $E_i$):

$E_i = O \Rightarrow R_i$ does not contain any information,
$E_i = 1 \Rightarrow R_i$ contains one item of information.

The operation of this memory is as follows: the data supplied by the multiplexer are transferred via the channel 200 to the registers $R_1$ to $R_{10}$. The data pass out of the buffer memory via channel 56. The channel DRDY is connected to the computer which delivers pulsed signals when said computer has received a datum. The output Q of the computer $E_{10}$, CREQ indicates to the computer that a datum is in readiness at the input.

For illustrative purposes suppose that the memory is vacant (all the status words are in state 0) and that a number of data-collection orders are received by the flip-flop:

First Data Collection Order

A datum is transferred into the register $R_1$ and the flip-flop $E_1$ is set into state 1 (that is, its output Q = 1). Since $E_2 = 0$, the assembly ($R_2$, $E_2$) is transparent and the content of ($R_1$, $E_1$) is transferred into ($R_2$, $E_2$). When the flip-flop $E_2$ changes to state 1, the flip-flop $E_1$ is reversed to state 0 (the pulser $P_1$ emits a pulse at the time of the 0 → 1 transition of the flip-flop $E_2$) and the register $R_1$ is in readiness for a further data collection. The status words $E_3$ to $E_{10}$ are in state 0 and the process is repeated until the datum arrives in the register $R_{10}$.

We than have $E_i = 0$ ($i = 1$ to 9) and $E_{10} = 1$.

Second Data Collection Order

As in the previous instance, the datum is propagated to the register $R_9$ and since the register $R_{10}$ is blocked, the datum is stored in the register $R_9$ ($E_9 = 1$).

It is apparent that each datum is stored in the last vacant register (provision is made for a stack of registers). At the tenth data-collection order, the datum remains in the register $R_1$. The memory is then fully loaded and no other datum can be transferred to this latter.

$E_1 = 1$ initiates the inhibition of data-collection orders.

Consideration will now be given to the output of data. The status word $E_{10}$ indicates to the computer via channel CREQ that a datum is in readiness at the output ($E_{10} = 1$). As soon as said datum has been recorded, the computer indicates that this has taken place by transmitting a pulse into the channel DRDY.

Said pulse resets the flip-flop $E_{10}$ to 0 and the assembly ($R_{10}$, $E_{10}$) becomes transparent; ($R_9$, $E_9$) is therefore transferred into ($R_{10}$, $E_{10}$) and this operation causes the flip-flop $E_9$ to be reset as soon as the flip-flop $E_{10}$ changes to state 1. The process is repeated and all the data advance by one step. Each datum output result in a shift, the appearance of a fresh datum at the output, and permits a fresh acquisition at the input.

In addition to the large number of advantages mentioned in the foregoing, the device in accordance with the invention makes it possible to process signals recorded on an oscilloscope screen by means of combinations of electronic devices of conventional type, thus facilitating construction and reducing capital cost. Finally, the automatic process for observing the center of the trace of the signal $x(t)$ avoids the need for a study of microdensitometry on photographs whereas such a study was essential in the prior art and proved to be particularly tedious.

What we claim is:
1. A device for automatic processing of signals recorded on an oscilloscope screen, wherein said device comprises:
   an oscilloscope screen scanned by the signal $x(t)$ to be recorded as a function of the time interval $t$,
   a camera which is optically adjusted so as to produce the image of the oscilloscope screen on a storage target,
   a unit for electron scanning of said storage target in which the scan consists of a series of lines which are parallel to each other and perpendicular to the time axis of the image $x'(t)$ of the signal $x(t)$ on said storage target, said lines being such as to correspond to the scanning of the point of impact of an electron beam on said target, and for producing for each line a signal $y(\tau)$ containing a profile of the intersection of the electron beam with the image $x'(t)$ of the signal $x(t)$ on the storage target, the parameter $\tau$ being such as to vary between 0 and its maximum value in the case of each line,
   electronic means for associating with each line, in a line address counter, a line address $n$ which varies from 1 to N,
   a coder responsive to said line address counter and to said signals $y(\tau)$ for associating with each line address $n$ in a word-address counter a raw word address $m$ which varies between 1 and M at each instant of appearance of said respective signals $y(\tau)$ from which at least one final word address $m$ is to be obtained for recording in paired association with the line address $n$, said coder including also electronic means for comparing the signal $y(\tau)$ with a series of threshold values having increasing amplitudes $S_1, S_2 \ldots S_i \ldots S_k$, means responsive to said comparing means for generating signals of constant amplitude $M_i(\tau) = AY[y(\tau) - S_i]$ where $Y$ is the step function having an amplitude equal to 1 when and only when:

$$y(\tau) - S_i \geq 1$$

$A$ being a coefficient of proportionality which is independent of the parameter, means responsive to said signals $M_i(\tau)$ for selecting the nonzero signal $M_i(\tau)$ which corresponds in the case of each signal $y(\tau)$ to the maximum threshold value of $S_i$ and means for calculating in response to each said selected signal $M_i(\tau)$ the final word address $m$ by reference to the value of the time parameter $\tau$ corresponding to the half-sum of the values of $\tau$ which are associated with the leading edge and with the trailing edge of the selected signal $M_i(\tau)$, and
   means for recording sequentially the pairs of addresses $(n, m)$ on a digital memory.

2. A device according to claim 1, wherein the means for recording the pairs of addresses $(n, m)$ comprise in addition a buffer memory for recording the address pairs $(n, m)$ sequentially at the rate of creation of said address pairs from the coder and for returning said address pairs $(n, m)$ at a rate corresponding to the rate of recording of a computer memory.

3. A device according to claim 1, wherein said device comprises:
   a clock H for delivering a first series $H_1$ of electrical pulses having a frequency $f_A$ and a second series of pulses $H'_1$ having the same frequency displaced by one half-period with respect to the corresponding pulses of the series $H_1$,
   a frequency divider responsive to the clock for delivering pulses having a frequency $f_B$ which is a submultiple of the frequency $f_A$, said pulses having a frequency $f_B$ being provided for control of the line synchronization of the line scanning unit of the electronic camera,
   the line address counter of said electronic line address association means being incremented by one unit at each line-synchronizing pulse having a frequency $f_B$,
   said electronic comparing means including a comparator supplied at one input by the line-scanning signal $y(\tau)$ and at the other input by the direct-current signal which corresponds to a threshold value $S_1$ and delivers at the output a signal $M_1(\tau)$ which is equal to $AY[y(\tau) - S_1]$,
   electronic means for synchronizing the signal $M_1(\tau)$ with the signal $H_1$ derived from the clock H,
   said word address counter of said coder comprising two counting units, the first unit being supplied by the clock signal $H_1$, the second unit being supplied by the clock signal $H'_1$, triggering or zero-resetting of the first counting unit being associated with the line-synchronizing signal and the second counting unit being connected to the first counting unit with a register displacement by one binary unit and logical synchronization means for carrying out at the time of each start of the synchronized signal $M_1(\tau)$ the transfer of the content of the first counting unit into the second counting unit and for triggering said second counting unit at the commencement of transfer and for locking said unit on the trailing edges of the synchronized signal $M_1(\tau)$,
   a scale-of-two divider in said coder for the signal derived from the second counting unit, said divider being intended to deliver the final word address $m$,
   a multiplexer in said sequentially recording means which is connected to the line address counter for recording the line address during the time of the line-synchronizing signal and which is also connected to said divider for recording the word address outside the line-synchronizing signal.

4. A device according to claim 3, wherein said electronic comparing means comprises a plurality of parallel-connected comparators similar to said comparator all supplied by the signal $y(\tau)$ which corresponds to different thresholds having increasing values $S_1 \ldots S_i \ldots S_k$ and electronic means for selecting the nonzero signal $M_i(\tau) = AY[y(\tau) - S_i]$ which corresponds to the maximum value of $S_i$ and for computing by means of said signal the final word address or addresses $m_i$ corresponding to the mean values of of the leading edges and of the trailing edges of $M_i(\tau)$.

5. A device according to claim 4, wherein there is placed in front of each comparator a low-pass filter whose cut-off frequency increases as a function of the threshold value, which is associated with said comparator.

* * * * *